(12) United States Patent
Haran (10) Patent No.: US 11,758,098 B2
(45) Date of Patent: *Sep. 12, 2023

(54) SYNCHRONIZATION CIRCUIT FOR OSCILLATING MIRROR AND LASER

(71) Applicant: STMicroelectronics LTD, Netanya (IL)

(72) Inventor: Elik Haran, Kfar Saba (IL)

(73) Assignee: STMicroelectronics LTD, Netanya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 17/987,250

(22) Filed: Nov. 15, 2022

(65) Prior Publication Data
US 2023/0070845 A1 Mar. 9, 2023

Related U.S. Application Data

(63) Continuation of application No. 16/806,572, filed on Mar. 2, 2020, now Pat. No. 11,528,456, which is a continuation of application No. 15/689,871, filed on Aug. 29, 2017, now Pat. No. 10,623,706.

(51) Int. Cl.
| | | |
|---|---|---|
| G02B 26/08 | (2006.01) | |
| H04N 9/31 | (2006.01) | |
| H04N 5/06 | (2006.01) | |
| H03L 7/08 | (2006.01) | |
| H03K 21/40 | (2006.01) | |

(52) U.S. Cl.
CPC ............ H04N 9/3135 (2013.01); H04N 5/06 (2013.01); H04N 9/3155 (2013.01); H04N 9/3161 (2013.01); H03K 21/40 (2013.01); H03L 7/08 (2013.01)

(58) Field of Classification Search
CPC .. H04N 9/3135; H04N 9/3155; H04N 9/3161; H04B 5/06; H03K 21/40; H03L 7/08
See application file for complete search history.

(56) References Cited

U.S. PATENT DOCUMENTS

| | | | |
|---|---|---|---|
| 8,581,643 B1 | 11/2013 | Schmitt | |
| 10,623,706 B2 * | 4/2020 | Haran | H04N 5/06 |
| 11,528,456 B2 * | 12/2022 | Haran | H04N 9/3155 |
| 2015/0161926 A1 | 6/2015 | Ogi et al. | |

* cited by examiner

Primary Examiner — Euncha P Cherry
(74) Attorney, Agent, or Firm — CROWE & DUNLEVY (57) ABSTRACT

A control system includes a mirror controller generating horizontal and vertical mirror synchronization signals for a mirror based upon a mirror clock signal. Laser modulation circuitry generates horizontal and vertical laser synchronization signals as a function of first and second laser clock signals and generates control signals for a laser that emits a laser beam that impinges on the mirror. First synchronization circuitry receives the horizontal mirror synchronization signal and the horizontal laser synchronization signal, and modifies generation of the first laser clock signal to achieve alignment between the horizontal mirror synchronization signal and horizontal laser synchronization signal. Second synchronization circuitry receives the vertical mirror synchronization signal and the vertical laser synchronization signal, and modifies generation of the second laser clock signal to achieve alignment between the vertical mirror synchronization signal and vertical laser synchronization signal.

18 Claims, 8 Drawing Sheets

SYNCHRONIZATION CIRCUIT FOR OSCILLATING MIRROR AND LASER

RELATED APPLICATION

This application is a continuation of U.S. patent application Ser. No. 16/806,572, filed Mar. 2, 2020, which itself is a continuation of U.S. patent application Ser. No. 15/689,871, filed Aug. 29, 2017, now U.S. Pat. No. 10,623,706, the contents of which are incorporated by reference in their entireties to the maximum extent allowable under the law.

TECHNICAL FIELD

This disclosure is related to the field of oscillating mirrors and lasers used to form laser projection systems and, in particular, to circuits, techniques, and methods for synchronizing signals between control circuits for the oscillating mirrors and control circuits for the lasers in such laser projection systems.

BACKGROUND

Certain devices such as wafer defect scanners, laser printers, document scanners, projectors and the like may employ a laser beam that scans across a flat surface in a straight line path. So as to effectuate this scanning, these devices employ tilting mirrors to deflect the laser beam. These tilting mirrors may be, or may include, Micro Electro Mechanical Systems ("MEMS") devices. The laser light reflected by the tiling mirrors may be of a visible wavelength (for instance, the three red/green/blue colors) or of invisible wavelength (for instance, infrared light for 3-D imaging).

Figure 1:
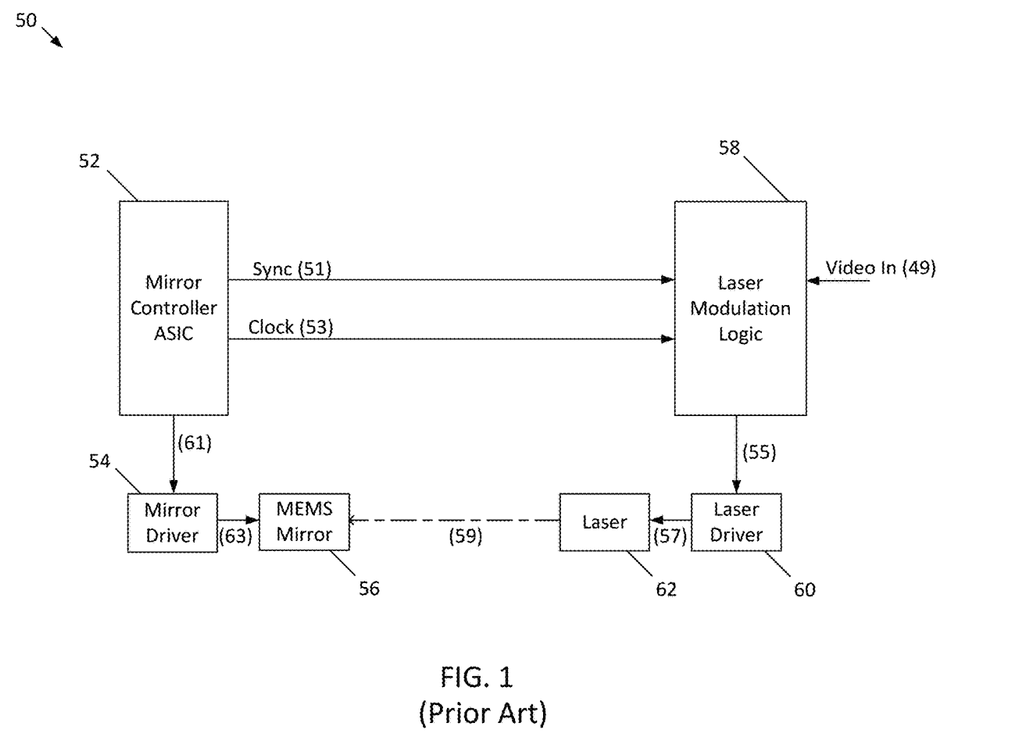
FIG. 1 is a block diagram of a conventional laser projection system.

A conventional laser projection system 50 is now described with reference to FIG. 1. The laser projection system 50 includes a MEMS mirror 56, driven by a mirror driver 54, which implements the desired drive signal, whether it be high current (for electromagnetically driven MEMS mirrors) or high voltage (for w or piezoelectrically driven mirrors). The mirror driver 54 is controlled by a mirror controller 52 using a control signal 61 to control the waveform and the amplitude of the output analog drive signal 63.

The mirror controller 52, which may be incorporated within an application specific integrated circuit (ASIC), also functions to drive a synchronization signal 51 and clock signal 53 toward laser modulation logic 58, which sends a control signal 55 to a laser driver 60, which in turn generates a drive signal 57 that modulates the laser 62 in order to position the correct pixel in the laser beam 59 in correspondence to the movement of the MEMS mirror 56. This synchronization is critical, because if the driving of the laser 62 and the MEMS mirror 56 are not properly synchronized, the desired scan pattern is not formed, and the laser projection system 50 is considered to have malfunctioned.

However, it may be undesirable to send the clock signal 53 from the mirror controller 52 to the laser modulation logic 58 for a variety of reasons. For example, the mirror controller 52 and laser modulation logic 58 may be located within separate integrated circuits, and thus a pin or pad would be required to send and receive the clock signal 53 via such pin or pad. Particularly in the case of a laser projection system 50 used for forming high resolution images, the clock signal 53 is of a high frequency (on the order of GHz), and thus the sending of the clock signal 53 would consume power on the order of tens of milliwatts. This is undesirable for portable electronics applications which run on battery power, such as picoprojectors, smartphones, modular add on devices for smartphones, tablets, smartwatches, and the like.

Therefore, further development of circuits, techniques, and methods for synchronizing the mirror controller and laser modulation logic within a laser projection system is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a control system for a laser scanning projector, including: a mirror controller configured to generate horizontal and vertical mirror synchronization signals for an oscillating mirror apparatus based upon a mirror clock signal; and laser modulation circuitry. The laser modulation circuitry is configured to: generate horizontal and vertical laser synchronization signals as a function of first and second laser clock signals; and generate control signals for a laser that emits a laser beam that impinges on the oscillating mirror apparatus. First synchronization circuitry is configured to: generate the first laser clock signal for output to the laser modulation circuitry; receive the horizontal mirror synchronization signal from the mirror controller; receive the horizontal laser synchronization signal from the laser modulation circuitry; and modify the first laser clock signal so as to achieve alignment between the horizontal mirror synchronization signal and the horizontal laser synchronization signal. Second synchronization circuitry is configured to: generate the second laser clock signal for output to the laser modulation circuitry; receive the vertical mirror synchronization signal from the mirror controller; receive the vertical laser synchronization signal from the laser modulation circuitry; and modify the second laser clock signal so as to achieve alignment between the vertical mirror synchronization signal and the vertical laser synchronization signal.

The vertical mirror synchronization signal may be a non-integer multiple of the horizontal mirror synchronization signal.

The first synchronization circuitry may modify the first laser clock signal by: comparing the horizontal mirror synchronization signal to the horizontal laser synchronization signal; and modifying the first laser clock signal so that the horizontal mirror synchronization signal and horizontal laser synchronization signal are equal in frequency, and so that a phase difference between the horizontal mirror synchronization signal and horizontal laser synchronization signal remains constant.

The first synchronization circuitry may compare the horizontal mirror synchronization signal to the horizontal laser synchronization signal by: counting a first number of pulses of the first laser clock signal between two consecutive same type edges of the horizontal mirror synchronization signal; counting a second number of pulses of the first laser clock signal between two consecutive same type edges of the horizontal laser synchronization signal; determining a frequency alignment error between the horizontal mirror synchronization signal and the horizontal laser synchronization signal as a function of a difference between the first and second numbers of pulses; and adjusting a frequency of the first laser clock signal as a function of the frequency alignment error such that the horizontal mirror synchronization signal and horizontal laser synchronization signal are equal in frequency and the phase difference therebetween remains constant.

The second synchronization circuitry may modify the second laser clock signal by: comparing the vertical mirror synchronization signal to the vertical laser synchronization signal; and modifying the second laser clock signal so that the vertical mirror synchronization signal and vertical laser synchronization signal are equal in frequency, and so that a phase difference between the vertical mirror synchronization signal and vertical laser synchronization signal remains constant.

The second synchronization circuitry may compare the vertical mirror synchronization signal to the vertical laser synchronization signal by: counting a third number of pulses of the second laser clock signal between two consecutive same type edges of the vertical mirror synchronization signal; counting a fourth number of pulses of the second laser clock signal between two consecutive same type edges of the vertical laser synchronization signal; determining a frequency alignment error between the vertical mirror synchronization signal and the vertical laser synchronization signal as a function of a difference between the third and fourth numbers of pulses; and adjusting a frequency of the second laser clock signal as a function of the frequency alignment error such that the vertical mirror synchronization signal and vertical laser synchronization signal are equal in frequency and the phase difference therebetween remains constant.

Method aspects are disclosed herein as well. One method includes: driving an oscillating mirror with a mirror drive signal; adjusting the mirror drive signal based upon a mirror sense signal received from the oscillating mirror so that the oscillating mirror reaches a desired opening angle; driving a laser emitter with a laser drive signal, based upon first and second laser clock signals, so as to generate a laser that impinges upon the oscillating mirror; generating a vertical mirror synchronization signal as being a non-integer multiple of a horizontal mirror synchronization signal; generating a vertical laser synchronization signal and a horizontal laser synchronization signal; modifying the first laser clock signal so as to achieve alignment between the horizontal mirror synchronization signal and the horizontal laser synchronization signal; and modifying the second laser clock signal so as to achieve alignment between the vertical mirror synchronization signal and the vertical laser synchronization signal.

The modification of the first laser clock signal may be performed by first synchronization circuitry and modification of the second laser clock signal may be performed by second synchronization circuitry.

The first laser clock signal may be modified by: comparing the horizontal mirror synchronization signal to the horizontal laser synchronization signal; and modifying the first laser clock signal so that the horizontal mirror synchronization signal and horizontal laser synchronization signal are equal in frequency, and so that a phase difference between the horizontal mirror synchronization signal and horizontal laser synchronization signal remains constant.

The horizontal mirror synchronization signal may be compared to the horizontal laser synchronization signal by: counting a first number of pulses of the first laser clock signal between two consecutive same type edges of the horizontal mirror synchronization signal; counting a second number of pulses of the first laser clock signal between two consecutive same type edges of the horizontal laser synchronization signal; determining a frequency alignment error between the horizontal mirror synchronization signal and the horizontal laser synchronization signal as a function of a difference between the first and second numbers of pulses; and adjusting a frequency of the first laser clock signal as a function of the frequency alignment error such that the horizontal mirror synchronization signal and horizontal laser synchronization signal are equal in frequency and the phase difference therebetween remains constant.

The second laser clock signal may be modified by: comparing the vertical mirror synchronization signal to the vertical laser synchronization signal; and modifying the second laser clock signal so that the vertical mirror synchronization signal and vertical laser synchronization signal are equal in frequency, and so that a phase difference between the vertical mirror synchronization signal and vertical laser synchronization signal remains constant.

The vertical mirror synchronization signal is compared to the vertical laser synchronization signal by: counting a third number of pulses of the second laser clock signal between two consecutive same type edges of the vertical mirror synchronization signal; counting a fourth number of pulses of the second laser clock signal between two consecutive same type edges of the vertical laser synchronization signal; determining a frequency alignment error between the vertical mirror synchronization signal and the vertical laser synchronization signal as a function of a difference between the third and fourth numbers of pulses; and adjusting a frequency of the second laser clock signal as a function of the frequency alignment error such that the vertical mirror synchronization signal and vertical laser synchronization signal are equal in frequency and the phase difference therebetween remains constant.

Another method disclosed herein includes: driving an oscillating mirror with a mirror drive signal; adjusting the mirror drive signal based upon a mirror sense signal received from the oscillating mirror so that the oscillating mirror reaches a desired opening angle; driving a laser emitter with a laser drive signal, based upon first and second laser clock signals, so as to generate a laser that impinges upon the oscillating mirror; generating a vertical mirror synchronization signal as being an integer multiple of a horizontal mirror synchronization signal; generating a vertical laser synchronization signal and a horizontal laser synchronization signal; modifying the first laser clock signal so as to achieve alignment between the horizontal mirror synchronization signal and the horizontal laser synchronization signal; and modifying the second laser clock signal so as to achieve alignment between the vertical mirror synchronization signal and the vertical laser synchronization signal.

The modification of the first laser clock signal and the modification of the second laser clock signal may be performed by synchronization circuitry.

The first laser clock signal may be modified by: comparing the horizontal mirror synchronization signal to the horizontal laser synchronization signal; and modifying the first laser clock signal so that the horizontal mirror synchronization signal and horizontal laser synchronization signal are equal in frequency, and so that a phase difference between the horizontal mirror synchronization signal and horizontal laser synchronization signal remains constant.

The horizontal mirror synchronization signal may be compared to the horizontal laser synchronization signal by: counting a first number of pulses of the first laser clock signal between two consecutive same type edges of the horizontal mirror synchronization signal; counting a second number of pulses of the first laser clock signal between two consecutive same type edges of the horizontal laser synchronization signal; determining a frequency alignment error between the horizontal mirror synchronization signal and the horizontal laser synchronization signal as a function of a difference between the first and second numbers of pulses; and adjusting a frequency of the first laser clock signal as a function of the frequency alignment error such that the horizontal mirror synchronization signal and horizontal laser synchronization signal are equal in frequency and the phase difference therebetween remains constant.

The second laser clock signal may be modified by: comparing the vertical mirror synchronization signal to the vertical laser synchronization signal; and modifying the second laser clock signal so that the vertical mirror synchronization signal and vertical laser synchronization signal are equal in frequency, and so that a phase difference between the vertical mirror synchronization signal and vertical laser synchronization signal remains constant.

The vertical mirror synchronization signal may be compared to the vertical laser synchronization signal by: counting a third number of pulses of the second laser clock signal between two consecutive same type edges of the vertical mirror synchronization signal; counting a fourth number of pulses of the second laser clock signal between two consecutive same type edges of the vertical laser synchronization signal; determining a frequency alignment error between the vertical mirror synchronization signal and the vertical laser synchronization signal as a function of a difference between the third and fourth numbers of pulses; and adjusting a frequency of the second laser clock signal as a function of the frequency alignment error such that the vertical mirror synchronization signal and vertical laser synchronization signal are equal in frequency and the phase difference therebetween remains constant.

DETAILED DESCRIPTION

One or more embodiments of the present disclosure will be described below. These described embodiments are only examples of the presently disclosed techniques. Additionally, in an effort to provide a concise description, certain nonessential features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 2:
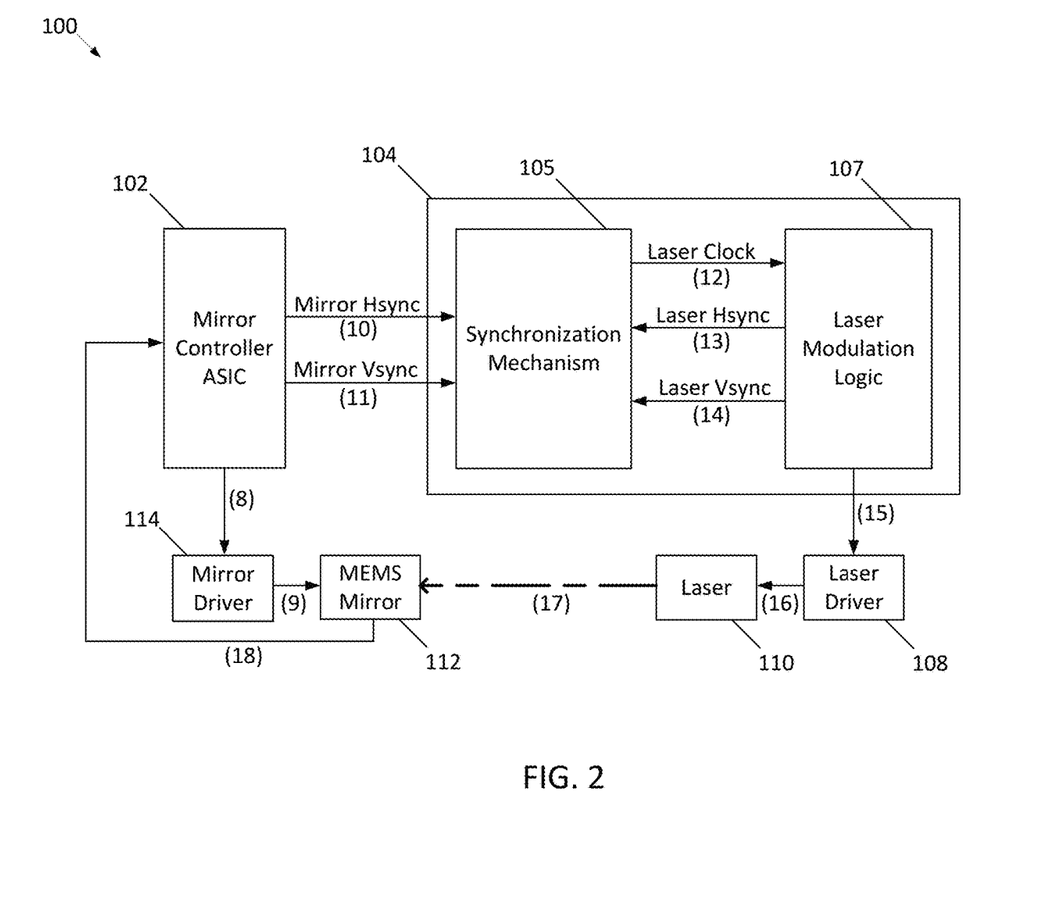
FIG. 2 is a schematic block diagram of a first embodiment of a laser projection system in accordance with this disclosure.

With initial reference to FIG. 2, a laser projection system 100 is now described. The laser projection system 100 includes a MEMS mirror 112 which is driven with a drive signal 9 generated by a mirror driver 114. The driving of the MEMS mirror 112 by the mirror driver 114 may be electromagnetically, electrostatically, quasistatically, piezoelectrically, or in any other suitable fashion.

The mirror driver 114 is controlled by a control signal 8 from a mirror controller 102, which may be an ASIC (application specific integrated circuit). The mirror controller 102 receives a mirror sense signal 18 from the MEMS mirror 112 as feedback, and based upon analysis or processing of the received mirror sense signal 18, alters the control signal 8 so as to cause the MEMS mirror 112 to be driven to a desired opening angle.

The mirror controller 102 is depicted as further generating both a horizontal sync HSync 10 signal and a vertical sync VSync 11 signal and sending both signals to synchronization mechanism 105, but it should be understood that in some applications, only one of the synchronization signals (for example, HSync 10) is sent to the synchronization mechanism 105.

The synchronization mechanism 105 also generates a clock 12. The synchronization mechanism 105 also receives versions of the HSync 13 and VSync 14 signals generated internally by the laser modulation logic 107, and modifies the clock 12 for the laser modulation logic 107 as a function of a comparison between HSync 10 and VSync 11 from the mirror controller 102 and HSync 13 and VSync 14 from the laser modulation logic 107. It should be understood that in some applications, only one of the synchronization signals (for example, HSync 13) is sent to the synchronization mechanism 105 by the laser modulation logic 107. Likewise, it should be understood that the modification of the clock 12 may be performed based upon a comparison of Hsync 10 to HSync 13, without comparisons being performed on and between Vsync 11 and Vsync 14. In these applications, VSync 11 is an integer multiple of HSync 10, and VSync 14 is an integer multiple of HSync 13, and thus VSync 14 may be generated from HSync 13. Therefore, since VSync 14 is generated from HSync 13 in these cases, the performance of a separate synchronization on VSync 11 and VSync 14 is not necessary.

It should further be understood that the generation of the clock 12 is performed without receipt of an internal clock signal from the mirror controller 102, and that HSync 10, VSync 11, HSync 13, and VSync 14 all have frequencies that are less than that of the clock 12 and the clock internal to the mirror controller 102.

As noted, the laser modulation logic 107 generates HSync 13 and VSync 14. HSync 13 and VSync 14 are generated by the laser modulation logic 107 based upon the clock 12. Thus, as will be explained below, by controlling the clock 12, HSync 13 and VSync 14 can be controlled.

The laser modulation logic 107 uses the clock 12, as well as HSync 13 and VSync 14, to generate a control signal 15 for laser driver 108, which generates a drive current 16 for the laser 110. The laser 110 emits a laser beam 17 as a function of the drive current 16.

Figure 4:
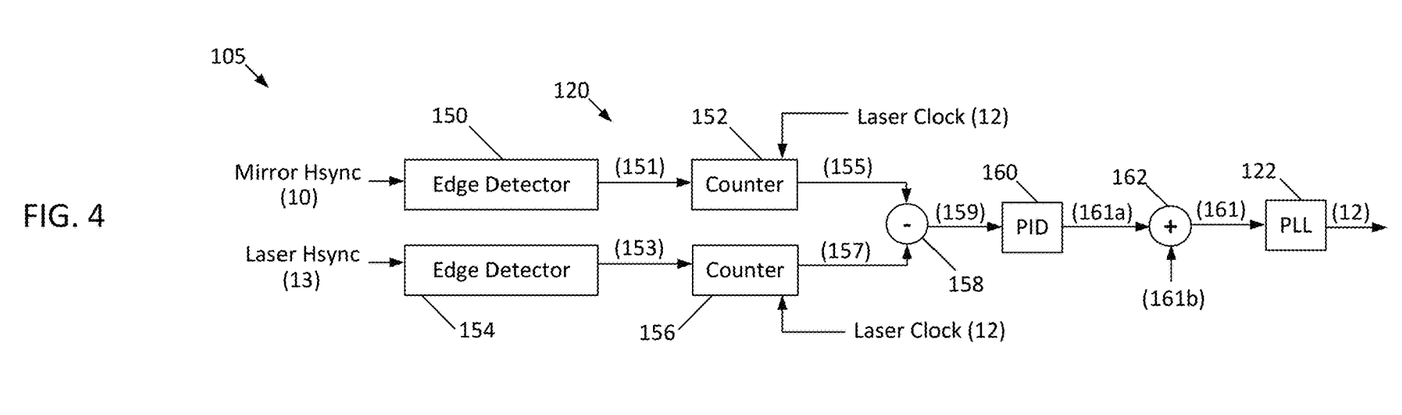
FIG. 4 is a schematic block diagram of circuitry within the synchronization mechanism of FIGS. 2-3 for aligning the frequency of synchronization signals generated externally to the mirror controller with that of synchronization signals generated within the mirror controller.

The synchronization performed by the synchronization mechanism 105 will now be described. Here, the synchronization refers to the synchronization of the clock 12 to the clock internal to the mirror controller 102, in both frequency and phase. First, the synchronization in frequency will be described. Referring additionally to FIG. 4, the synchronization mechanism 105 includes a clock control circuit 120, which itself includes edge detectors 150 and 154. Edge detector 150 receives HSync 10 while edge detector 154 receives HSync 13. At each detection of a rising edge of HSync 10, edge detector 150 asserts its output signal 151; similarly, at each detection of a rising edge of HSync 13, edge detector 154 asserts its output signal 153. Counters 152 and 156 respectively receive the output signals 151 and 153, and count cycles of clock 12 between one assertion of the output signals 151 and 153, and an immediately subsequent assertion of output signals 151 and 153. Thus, the edge detectors 150, 154 work in conjunction with the counters 152, 156 to count the number of pulses of clock 12 between two consecutive rising edges of HSync 10 and HSync 13. The counters 152 and 156 output their clock counts as signals 155 and 157 to subtractor 158, which determines the difference in the counts, as signal 159.

It is noted that the number of pulses of clock 12 between two consecutive rising (i.e., same type) edges of HSync 10, multiplied by the period of the clock 12, is the frequency of the MEMS mirror 112. Similarly, the number of pulses of clock 12 between two consecutive rising (i.e., same type) edges of HSync 13, multiplied by the period of the clock 12, is the estimated frequency of the MEMS mirror 112.

Figure 5A:
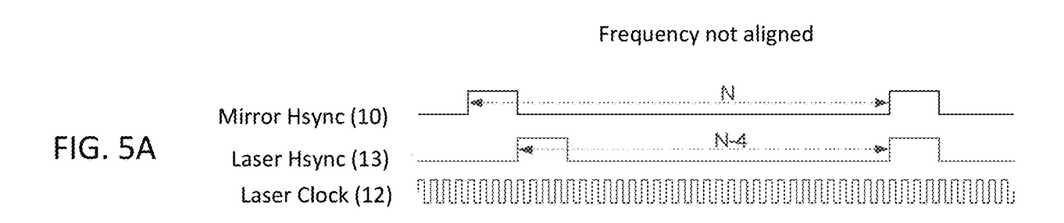
FIGS. 5A-5B respectively show the states of the frequency of the synchronization signals of FIG. 4 not being aligned, and then being aligned.
Figure 5B:
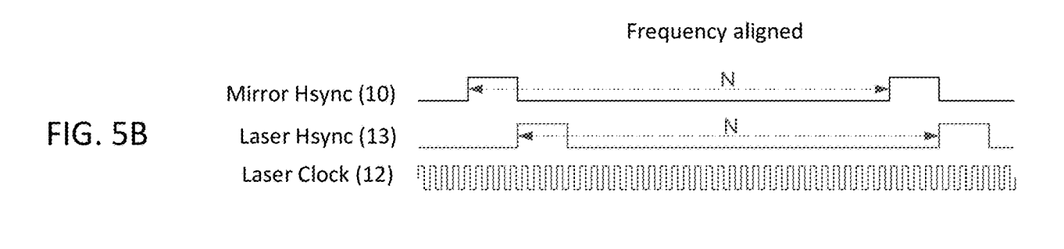

Thus, since HSync 13 and VSync 14 are generated as a function of the clock 12, when there is a difference between the counts determined by counters 152 and 156, the frequency of clock 12 is not matched to that of the internal clock of the mirror controller 102. This difference is generated as a frequency alignment error signal 159, which is passed to a control loop 160 (e.g. a proportional-integral-derivative loop) that generates a control word 161a Control word 161a is added to control word 161b (the generation of which will be described below but relates to phase alignment) by adder 162, to produce control word 161 for a digital phase locked loop 122, that in turn generates the clock 12. Thus, through this mechanism, the clock 12 is adjusted until there is no frequency mismatch between HSync 10 and HSync 13, meaning that there is no frequency mismatch between the clock 12 and the internal clock of the mirror controller 102. FIG. 5A depicts a frequency mismatch between HSync 10 and HSync 13, and FIG. 5B shows frequency alignment between HSync 10 and HSync 13. As shown, the number of pulses of the clock 12 in one period of Hsync 10 is N. In the mismatch shown in FIG. 5A, the number of pulses of the clock 12 in one period of HSync 13 is N–4. However, in the match shown in FIG. 5B, the number of pulses of the clock 12 in one period of Hsync 10 is N, and likewise the number of pulses of the clock 12 in one period of HSync 13 is N.

Figure 6:
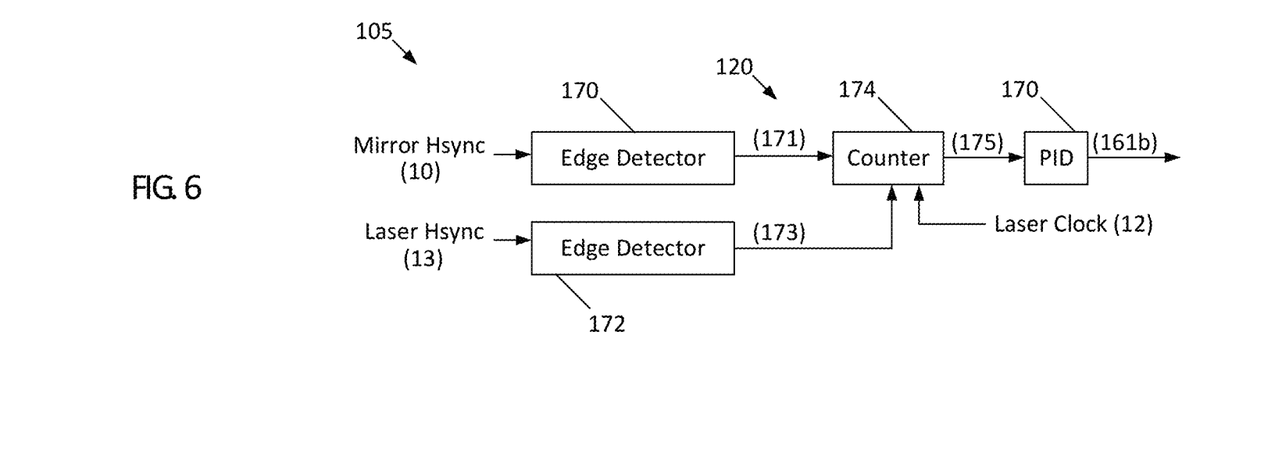
FIG. 6 is a schematic block diagram of circuitry within the synchronization mechanism of FIGS. 2-3 for aligning the phase of synchronization signals generated externally to the mirror controller with that of synchronization signals generated within the mirror controller.
Figure 7A:
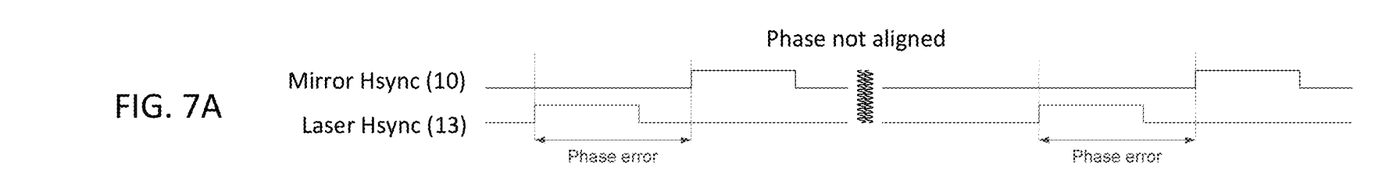
FIGS. 7A-7B respectively show the states of the phase of the synchronization signals of FIG. 6 not being aligned, and then being aligned.
Figure 7B:
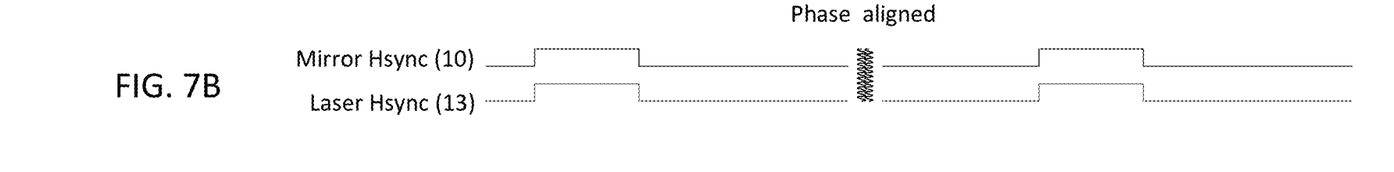

Now, the synchronization of the clock 12 to the clock internal to the mirror controller 102 in phase will be described with additional reference to FIG. 6. Here, the clock control circuit 120 includes edge detectors 170 and 172, which respectively receive HSync 10 and Hsync 13. At each receipt of a rising edge, the edge detectors 170 and 172 assert their output signals 171 and 173. The counter 174 receives output signals 171 and 173, and counts the number of pulses of clock 12 between assertions of output signals 171 and 173. The count signal 175 generated by counter 174 is passed to a control loop 170 (e.g. a proportional-integral-derivative loop) that generates the control word 161b for the PLL 122. Therefore, through this mechanism, the clock 12 is adjusted until there is no phase mismatch between HSync 10 and HSync 13, meaning that there is no phase mismatch between the clock 12 and the internal clock of the mirror controller 102. FIG. 7A depicts a phase mismatch between HSync 10 and HSync 13, and FIG. 7B shows phase alignment between HSync 10 and HSync 13.

It is noted that in some applications, operation for phase alignment does not begin until frequency alignment has been achieved. Thus, FIG. 6 generates the control word 161b with a value of 0 until the frequency is locked. Then, phase alignment begins and the FIG. 6 circuit generates the value for 161b that will align the phase.

It should be understood that the mirror controller 102 may be on a separate integrated circuit from the synchronization mechanism 105 and laser modulation logic 107, both of which may be integrated into a single integrated circuit 104 that is separate and distinct from the integrated circuit of the mirror controller 102. Stated another way, the mirror controller 102 is, in some cases, not located on a same integrated circuit as the synchronization mechanism 105 and laser modulation logic 107.

Alternative or additional embodiments will now be described. For example, in the laser projection system 100' shown in FIG. 3, HSync 13 and VSync 14 are generated by the synchronization mechanism 105 and not by the laser modulation logic 107. Operation of the laser projection system 100' otherwise proceeds as noted above.

Figure 3:
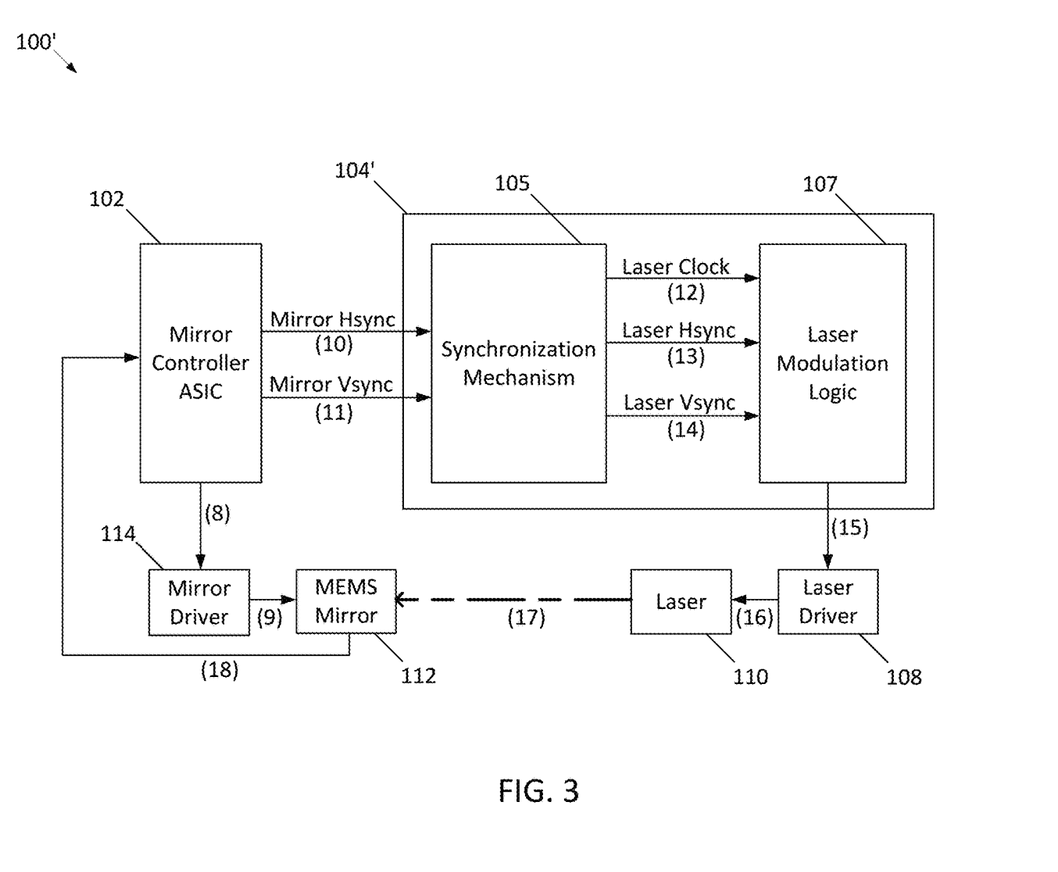
FIG. 3 is a schematic block diagram of a second embodiment of a laser projection system in accordance with this disclosure.
Figure 8:
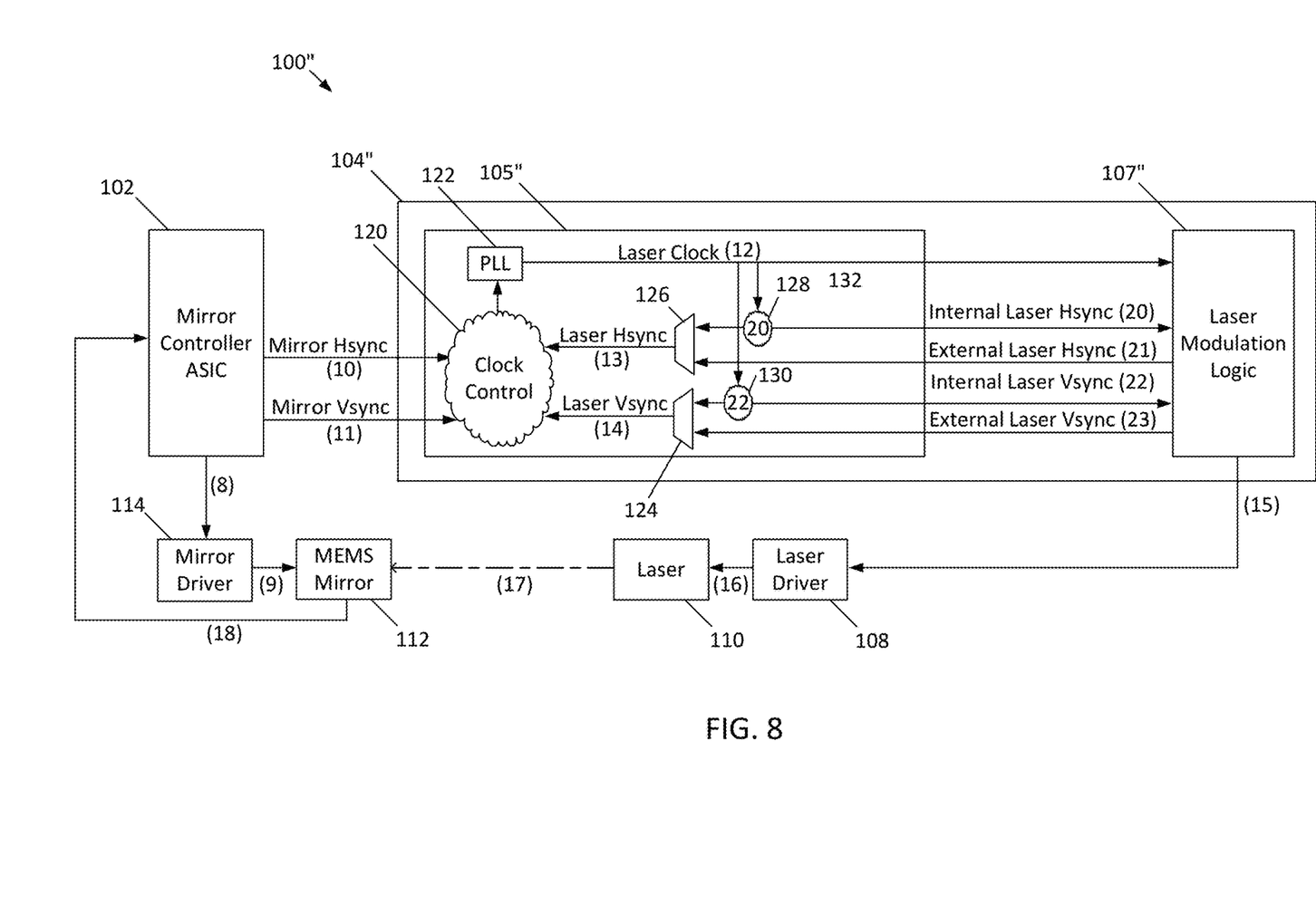
FIG. 8 is a schematic block diagram of a third embodiment of a laser projection system in accordance with this disclosure capable of operating as that of FIG. 2 in a first mode and as that of FIG. 3 in a second mode.

As another alternative, the laser projection system 100" shown in FIG. 8 is capable of operating according to the same process as the laser projection system 100' of FIG. 3, or the same process as the laser projection system 100" of FIG. 4. To effectuate this, the synchronization mechanism 105" includes multiplexers 126 and 124. Multiplexer 126 receives input from the laser modulation logic 107 in the form of HSync 21, and from HSync generator 128 (which is internal to the synchronization mechanism 105") in the form of Hsync 20. When operating as the laser projection system 100 of FIG. 2, the multiplexer passes HSync 21 as HSync 13 to the clock control circuit 120, the operation of which is the same as described above in other embodiments. When operating as the laser projection system 100' of FIG. 3, the multiplexer 126 passes HSync 20 as HSync 13 to the clock control circuit 120.

Multiplexer 124 receives input from the laser modulation logic 107 in the form of VSync 23, and from VSync generator 130 (which is internal to the synchronization mechanism 105″) in the form of Vsync 22. When operating as the laser projection system 100 of FIG. 2, the multiplexer passes VSync 23 as VSync 14 to the clock control circuit 120. When operating as the laser projection system 100′ of FIG. 3, the multiplexer 124 passes VSync 22 as VSync 14 to the clock control circuit 120.

Figure 9:
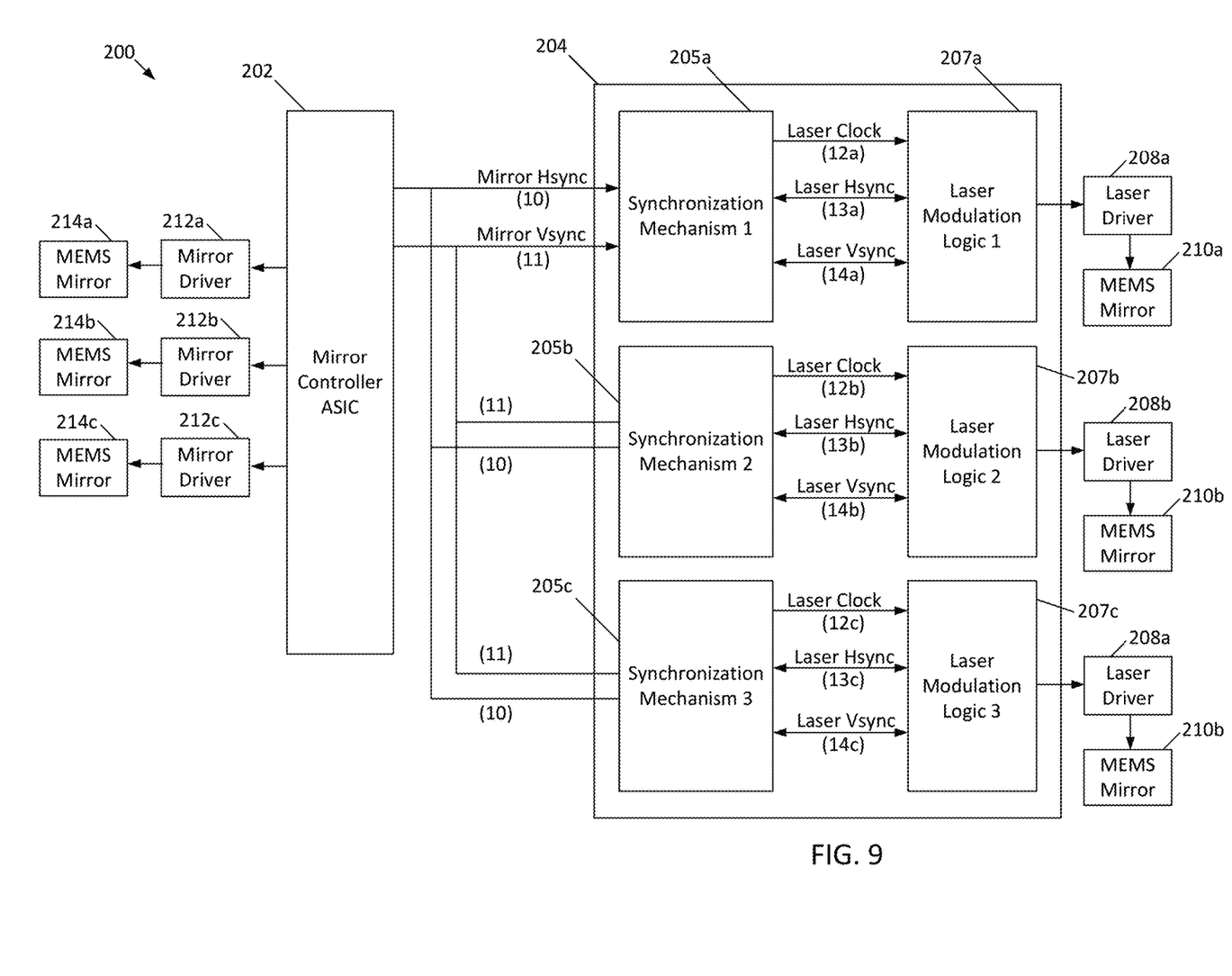
FIG. 9 is a schematic block diagram of a fourth embodiment of a laser projection system in accordance with this disclosure in which a single mirror controller interfaces with multiple synchronization mechanisms and multiple laser modulation logic circuits.

As shown in the laser projection system 200 of FIG. 9, a single mirror controller 202 may operate multiple MEMS mirrors 214a, 214b, 214c, and each mirror may have a respective laser 210a, 210b, 210c associated with it. Thus, as shown, the mirror controller 202 and may provide HSync 10 and VSync 11 to the respective different synchronization mechanisms 205a, 205b, 205c for respective different laser modulation logics 207a, 207b, 207c which operate respective different lasers 210a, 210b, 210c. The synchronization mechanisms 205a, 205b, 205cmay operate as any of the synchronization mechanisms described above.

Figure 10:
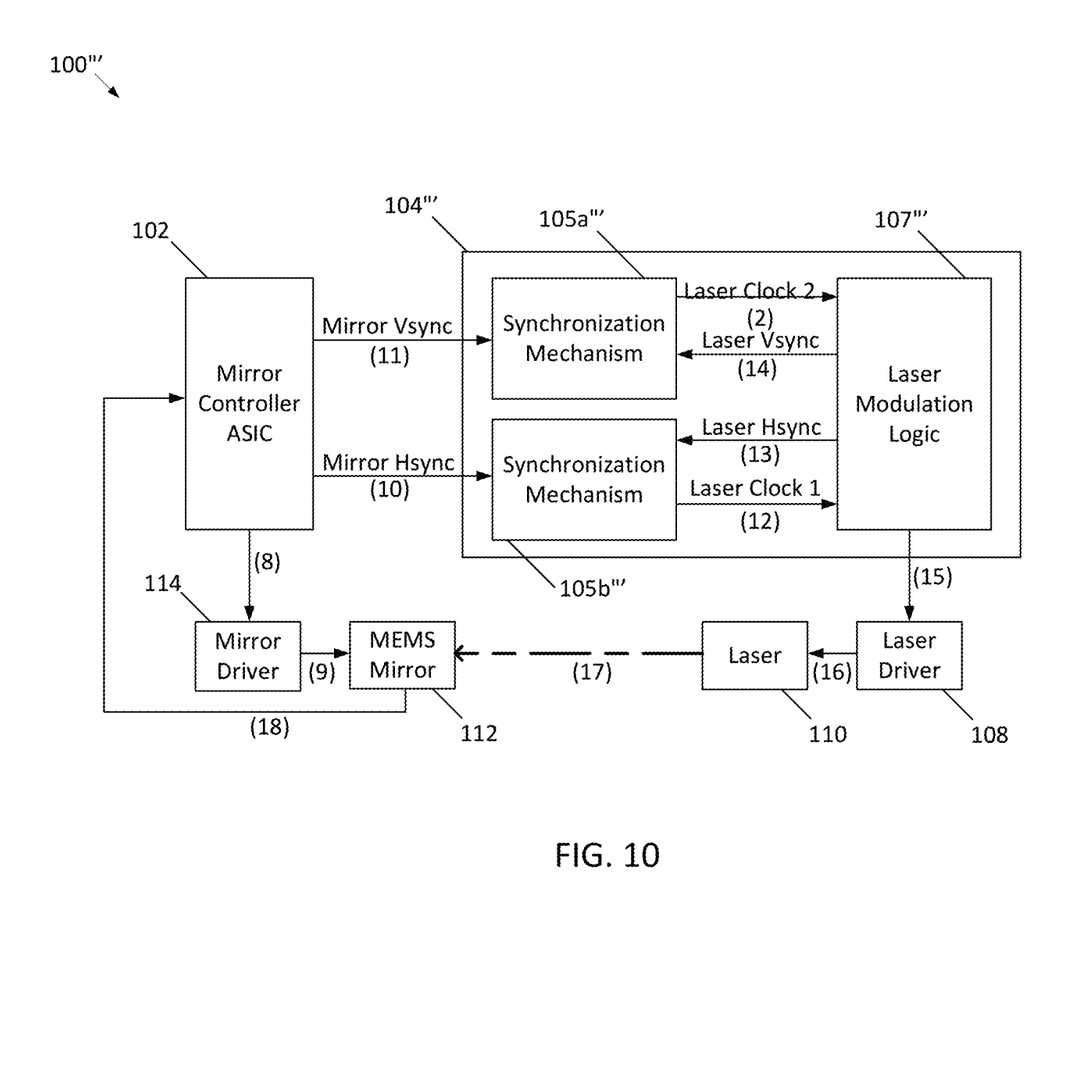
FIG. 10 is a schematic block diagram of a fifth embodiment of a laser projection system in accordance with this disclosure in which separate laser clocks are generated for use in generating the HSync and VSync signals.

As yet another variation shown in FIG. 10, in the case where VSync 11 is not an integer multiple of HSync 10, two separate synchronization blocks 105a‴, 105b‴, each operating as described above, can be used to generate two separate clocks 2 and 12. Synchronization block 105a‴ receives VSync 11 from the mirror controller 102, receives VSync 14 from laser modulation logic 107‴, performs the synchronization functions described above on VSync 11 and VSync 14 so as to generate clock 2. Similarly, synchronization block 105b‴ receives HSync 10 from the mirror controller 102, receives HSync 13 from laser modulation logic 107‴, and performs the synchronization functions described on HSync 10 and HSync 13 above so as to generate clock 12.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A control system for a laser scanning projector, comprising:
a mirror controller configured to generate horizontal and vertical mirror synchronization signals for an oscillating mirror apparatus based upon a mirror clock signal;
laser modulation circuitry configured to:
generate horizontal and vertical laser synchronization signals as a function of first and second laser clock signals; and
generate control signals for a laser that emits a laser beam that impinges on the oscillating mirror apparatus;
first synchronization circuitry configured to:
receive the horizontal mirror synchronization signal from the mirror controller;
receive the horizontal laser synchronization signal from the laser modulation circuitry; and
modify generation of the first laser clock signal so as to achieve alignment between the horizontal mirror synchronization signal and the horizontal laser synchronization signal; and
second synchronization circuitry configured to:
receive the vertical mirror synchronization signal from the mirror controller;
receive the vertical laser synchronization signal from the laser modulation circuitry; and
modify generation of the second laser clock signal so as to achieve alignment between the vertical mirror synchronization signal and the vertical laser synchronization signal.

2. The control system of claim 1, wherein the vertical mirror synchronization signal is a non-integer multiple of the horizontal mirror synchronization signal.

3. The control system of claim 1, wherein the first synchronization circuitry modifies generation of the first laser clock signal by:
comparing the horizontal mirror synchronization signal to the horizontal laser synchronization signal; and
controlling the first laser clock signal so that the horizontal mirror synchronization signal and horizontal laser synchronization signal are equal in frequency, and so that a phase difference between the horizontal mirror synchronization signal and horizontal laser synchronization signal remains constant.

4. The control system of claim 3, wherein the first synchronization circuitry compares the horizontal mirror synchronization signal to the horizontal laser synchronization signal by:
counting a first number of pulses of the first laser clock signal between two consecutive same type edges of the horizontal mirror synchronization signal;
counting a second number of pulses of the first laser clock signal between two consecutive same type edges of the horizontal laser synchronization signal;
determining a frequency alignment error between the horizontal mirror synchronization signal and the horizontal laser synchronization signal as a function of a difference between the first and second numbers of pulses; and
adjusting a frequency of the first laser clock signal as a function of the frequency alignment error such that the horizontal mirror synchronization signal and horizontal laser synchronization signal are equal in frequency and the phase difference therebetween remains constant.

5. The control system of claim 3, wherein the second synchronization circuitry modifies generation of the second laser clock signal by:
comparing the vertical mirror synchronization signal to the vertical laser synchronization signal; and
controlling the second laser clock signal so that the vertical mirror synchronization signal and vertical laser synchronization signal are equal in frequency, and so that a phase difference between the vertical mirror synchronization signal and vertical laser synchronization signal remains constant.

6. The control system of claim 5, wherein the second synchronization circuitry compares the vertical mirror synchronization signal to the vertical laser synchronization signal by:
counting a third number of pulses of the second laser clock signal between two consecutive same type edges of the vertical mirror synchronization signal;
counting a fourth number of pulses of the second laser clock signal between two consecutive same type edges of the vertical laser synchronization signal;
determining a frequency alignment error between the vertical mirror synchronization signal and the vertical laser synchronization signal as a function of a difference between the third and fourth numbers of pulses; and
adjusting a frequency of the second laser clock signal as a function of the frequency alignment error such that the vertical mirror synchronization signal and vertical laser synchronization signal are equal in frequency and the phase difference therebetween remains constant.

7. A method, comprising:
driving an oscillating mirror with a mirror drive signal;
adjusting the mirror drive signal based upon a mirror sense signal received from the oscillating mirror so that the oscillating mirror reaches a desired opening angle;
driving a laser emitter with a laser drive signal, based upon first and second laser clock signals, so as to generate a laser that impinges upon the oscillating mirror;
generating a vertical mirror synchronization signal as being a non-integer multiple of a horizontal mirror synchronization signal;
generating a vertical laser synchronization signal and a horizontal laser synchronization signal;
modifying the first laser clock signal so as to achieve alignment between the horizontal mirror synchronization signal and the horizontal laser synchronization signal; and
modifying the second laser clock signal so as to achieve alignment between the vertical mirror synchronization signal and the vertical laser synchronization signal.

8. The method of claim 7, wherein the modification of the first laser clock signal is performed by first synchronization circuitry; and wherein modification of the second laser clock signal is performed by second synchronization circuitry.

9. The method of claim 7, wherein the first laser clock signal is modified by:
comparing the horizontal mirror synchronization signal to the horizontal laser synchronization signal; and
controlling the first laser clock signal so that the horizontal mirror synchronization signal and horizontal laser synchronization signal are equal in frequency, and so that a phase difference between the horizontal mirror synchronization signal and horizontal laser synchronization signal remains constant.

10. The method of claim 9, wherein the horizontal mirror synchronization signal is compared to the horizontal laser synchronization signal by:
counting a first number of pulses of the first laser clock signal between two consecutive same type edges of the horizontal mirror synchronization signal;
counting a second number of pulses of the first laser clock signal between two consecutive same type edges of the horizontal laser synchronization signal;
determining a frequency alignment error between the horizontal mirror synchronization signal and the horizontal laser synchronization signal as a function of a difference between the first and second numbers of pulses; and
adjusting a frequency of the first laser clock signal as a function of the frequency alignment error such that the horizontal mirror synchronization signal and horizontal laser synchronization signal are equal in frequency and the phase difference therebetween remains constant.

11. The method of claim 9, wherein the second laser clock signal is modified by:
comparing the vertical mirror synchronization signal to the vertical laser synchronization signal; and
controlling the second laser clock signal so that the vertical mirror synchronization signal and vertical laser synchronization signal are equal in frequency, and so that a phase difference between the vertical mirror synchronization signal and vertical laser synchronization signal remains constant.

12. The method of claim 11, wherein the vertical mirror synchronization signal is compared to the vertical laser synchronization signal by:
counting a third number of pulses of the second laser clock signal between two consecutive same type edges of the vertical mirror synchronization signal;
counting a fourth number of pulses of the second laser clock signal between two consecutive same type edges of the vertical laser synchronization signal;
determining a frequency alignment error between the vertical mirror synchronization signal and the vertical laser synchronization signal as a function of a difference between the third and fourth numbers of pulses; and
adjusting a frequency of the second laser clock signal as a function of the frequency alignment error such that the vertical mirror synchronization signal and vertical laser synchronization signal are equal in frequency and the phase difference therebetween remains constant.

13. A method, comprising:
driving an oscillating mirror with a mirror drive signal;
adjusting the mirror drive signal based upon a mirror sense signal received from the oscillating mirror so that the oscillating mirror reaches a desired opening angle;
driving a laser emitter with a laser drive signal, based upon first and second laser clock signals, so as to generate a laser that impinges upon the oscillating mirror;
generating a vertical mirror synchronization signal as being an integer multiple of a horizontal mirror synchronization signal;
generating a vertical laser synchronization signal and a horizontal laser synchronization signal;
modifying the first laser clock signal so as to achieve alignment between the horizontal mirror synchronization signal and the horizontal laser synchronization signal; and
modifying the second laser clock signal so as to achieve alignment between the vertical mirror synchronization signal and the vertical laser synchronization signal.

14. The method of claim 13, wherein the modification of the first laser clock signal and the modification of the second laser clock signal is performed by synchronization circuitry.

15. The method of claim 13, wherein the first laser clock signal is modified by:
comparing the horizontal mirror synchronization signal to the horizontal laser synchronization signal; and
controlling the first laser clock signal so that the horizontal mirror synchronization signal and horizontal laser synchronization signal are equal in frequency, and so that a phase difference between the horizontal mirror synchronization signal and horizontal laser synchronization signal remains constant.

16. The method of claim 15, wherein the horizontal mirror synchronization signal is compared to the horizontal laser synchronization signal by:
counting a first number of pulses of the first laser clock signal between two consecutive same type edges of the horizontal mirror synchronization signal;
counting a second number of pulses of the first laser clock signal between two consecutive same type edges of the horizontal laser synchronization signal;
determining a frequency alignment error between the horizontal mirror synchronization signal and the horizontal laser synchronization signal as a function of a difference between the first and second numbers of pulses; and adjusting a frequency of the first laser clock signal as a function of the frequency alignment error such that the horizontal mirror synchronization signal and horizontal laser synchronization signal are equal in frequency and the phase difference therebetween remains constant.

17. The method of claim 15, wherein the second laser clock signal is modified by:
comparing the vertical mirror synchronization signal to the vertical laser synchronization signal; and
controlling the second laser clock signal so that the vertical mirror synchronization signal and vertical laser synchronization signal are equal in frequency, and so that a phase difference between the vertical mirror synchronization signal and vertical laser synchronization signal remains constant.

18. The method of claim 17, wherein the vertical mirror synchronization signal is compared to the vertical laser synchronization signal by:

counting a third number of pulses of the second laser clock signal between two consecutive same type edges of the vertical mirror synchronization signal;
counting a fourth number of pulses of the second laser clock signal between two consecutive same type edges of the vertical laser synchronization signal;
determining a frequency alignment error between the vertical mirror synchronization signal and the vertical laser synchronization signal as a function of a difference between the third and fourth numbers of pulses; and
adjusting a frequency of the second laser clock signal as a function of the frequency alignment error such that the vertical mirror synchronization signal and vertical laser synchronization signal are equal in frequency and the phase difference therebetween remains constant.

* * * * *